United States Patent
Hsiao et al.

(10) Patent No.: US 7,476,929 B2
(45) Date of Patent: Jan. 13, 2009

(54) MULTI-BIT STACKED-TYPE NON-VOLATILE MEMORY

(75) Inventors: Ching-Nan Hsiao, Taoyuan (TW); Chi-Hui Lin, Taoyuan (TW); Ying-Cheng Chuang, Taoyuan (TW)

(73) Assignee: Nanya Technology Corporation, Kueishan, Taoyuan (TW)

( * ) Notice: Subject to any disclaimer, the term of this patent is extended or adjusted under 35 U.S.C. 154(b) by 261 days.

(21) Appl. No.: 11/269,671

(22) Filed: Nov. 9, 2005

(65) Prior Publication Data

US 2006/0063339 A1 Mar. 23, 2006

Related U.S. Application Data

(62) Division of application No. 10/779,607, filed on Feb. 18, 2004, now Pat. No. 6,995,061.

(30) Foreign Application Priority Data

Jun. 24, 2003 (TW) .............................. 092117091 A

(51) Int. Cl.
*H01L 27/115* (2006.01)
*H01L 29/788* (2006.01)

(52) U.S. Cl. .............................. 257/316; 257/E27.103; 257/E29.301

(58) Field of Classification Search ......... 257/314–316, 257/E27.103, E29.301
See application file for complete search history.

(56) References Cited

U.S. PATENT DOCUMENTS

| | | | |
|---|---|---|---|
| 5,929,480 A * | 7/1999 | Hisamune | .................. 257/320 |
| 6,114,764 A | 9/2000 | Hoshino et al. | |
| 6,153,904 A | 11/2000 | Yang | |
| 6,155,537 A | 12/2000 | Yang | |
| 6,459,121 B1 * | 10/2002 | Sakamoto et al. | ............ 257/315 |
| 6,465,833 B1 * | 10/2002 | Jung et al. | .................. 257/314 |
| 6,528,414 B1 * | 3/2003 | Kasuya | ........................ 438/637 |
| 6,635,533 B1 | 10/2003 | Chang et al. | |
| 6,858,501 B2 * | 2/2005 | Hsu | ............................ 438/283 |
| 6,937,507 B2 * | 8/2005 | Chen | ............................ 365/163 |
| 6,998,671 B2 * | 2/2006 | Lue | ............................... 257/315 |
| 2002/0130357 A1 | 9/2002 | Hurley et al. | |
| 2004/0033657 A1 | 2/2004 | Chuang et al. | |
| 2004/0207007 A1 | 10/2004 | Lin et al. | |
| 2004/0214393 A1 | 10/2004 | Chem | |

FOREIGN PATENT DOCUMENTS

JP 7-235649 A 9/1995

* cited by examiner

*Primary Examiner*—M. Wilczewski
*Assistant Examiner*—Toniae M. Thomas
(74) *Attorney, Agent, or Firm*—Birch, Stewart, Kolasch & Birch, LLP

(57) ABSTRACT

The present invention discloses a multi-bit stacked-type non-volatile memory having a spacer-shaped floating gate and a manufacturing method thereof. The manufacturing method includes forming a patterned dielectric layer containing arsenic on a semiconductor substrate, wherein the patterned dielectric layer defines an opening as an active area. A dielectric spacer is formed on a side wall of the patterned dielectric layer and a gate dielectric layer is formed on the semiconductor substrate. A source/drain region is formed by thermal driving method making arsenic diffusion from the patterned dielectric layer into the semiconductor substrate. A spacer-shaped floating gate is formed on the side wall of the dielectric spacer and the gate dielectric layer. An interlayer dielectric layer is formed on the spacer-shaped floating gate. A control gate is formed on the interlayer dielectric layer and fills the opening of the active area.

7 Claims, 8 Drawing Sheets

MULTI-BIT STACKED-TYPE NON-VOLATILE MEMORY

CROSS REFERENCE TO RELATED APPLICATIONS

This application is a Divisional of co-pending application Ser. No. 10/779,607, filed on Feb. 18, 2004, and for which priority is claimed under 35 U.S.C. § 120; and this application claims priority of of Application No. 092117091 filed in Taiwan, R.O.C. on Jun. 24, 2003 under 35 U.S.C. § 119; the entire contents of all are hereby incorporated by reference.

FIELD OF THE INVENTION

The present invention relates to a non-volatile memory and the manufacture method thereof, and more particularly, to a multi-bit stacked-type non-volatile memory and the manufacture method thereof.

BACKGROUND OF THE INVENTION

Conventional memory components can be classified into two categories: Random Access Memory (RAM) and Read Only Memory (ROM). The data stored in RAM will disappear immediately after power supply is turned off, and thus RAM is also known as volatile memory. Contrarily, the data stored in ROM can be retained even without power supply. Therefore, ROM is also known as non-volatile memory. With the development of consumer electronics, ROM becomes more sophisticated. Various types of ROM emerge, such as Programmable ROM (PROM), Erasable & Programmable ROM (EPROM), Electrically Erasable &Programmable ROM (EEPROM), Flash Memory, and the likes. The flash memory becomes more and more popular because of noiseless, faster access, small in size, shock proof, and moisture proof relative to conventional products. Therefore, the flash memory is widely used in digital camera, mobile phone, MP3 player, and the likes.

The flash memory has a grid of bit lines and word lines with a cell that has two transistors at each intersection. The two transistors are separated from each other by a thin oxide layer. One of the transistors is known as a floating gate and the other one the control gate. The floating gate, located between the silicon substrate and the control gate, is surrounded by an insulation layer and does not link to word lines, bit lines, or any other wires. While data is written into the flash memory, a voltage higher than the drain voltage is applied to the control gate, thus hot electrons near the tunnel is produced. The hot electrons then accelerate and finally jump into the floating gate. The hot electrons then become trapped in the floating gate to complete data writing.

However, the portable electronic products become smaller and smaller while the requirement of the data storage capacity becomes larger and larger. Therefore, the main target is to simultaneously raise the product reliability and cell density of the memory. Several kinds of multi-bit non-volatile memory structures, such as the SONOS structure with nitride layers as the storage nodes, attempt to provide the above target. However, the cell density of SONOS structure is restricted by the disturbance effect of the storage electrons. Furthermore, the characteristics of the nitride layer lead to poor data retention. Thus, long-term stability of the memory is decreased when the nitride layer is used as the storage node.

On the other hand, the stacked-type non-volatile memory structure in accordance with the present invention provides long-term stability, high cell density, and a manufacture method with self-aligned floating gate to minimize the photolithography processes.

SUMMARY OF THE INVENTION

It is one aspect of the present invention to provide a stacked-type non-volatile memory including spacer-shaped floating gates and the manufacture method thereof in order to reduce the component size, increase the density of the memory cell, and increase the capacity of the memory.

It is another aspect of the present invention to provide a multi-bit stacked-type non-volatile memory without disturbance between storage electrons and the manufacture method thereof. Consequently, the long-term stability of the memory is increased.

It is a further aspect of the present invention to provide a multi-bit stacked-type non-volatile memory including self-aligned spacer-shaped floating gate to decrease the manufacture difficulty and raise the component reliability.

One embodiment of the present invention provides a multi-bit stacked-type non-volatile memory including a substrate, two dielectric islands containing arsenic, two source/drain region, two dielectric spacers, a gate dielectric layer, two spacer-shaped floating gates, an interlayer dielectric layer, and a control gate. The dielectric islands are disposed on the substrate and define an active area between two dielectric islands. Two dielectric spacers are respectively disposed on two side walls of the dielectric islands and over the substrate. The gate dielectric layer is disposed on the active area of the substrate. Two source/drain regions in the substrate are respectively located below two dielectric islands and formed by a thermal driving process to diffuse arsenic atoms from the dielectric islands into the substrate. Two dielectric spacers can prevent arsenic atoms from diffusing into the gate dielectric layer or other undesired areas. Two spacer-shaped floating gates are disposed on the gate dielectric layer and respectively located on two side walls of the dielectric spacers. The interlayer dielectric layer is disposed on the substrate and covers at least the spacer-shaped floating gates. The control gate is disposed on the interlayer dielectric layer and fills the active area.

Another embodiment of the present invention provides a method of manufacturing the multi-bit stacked-typed non-volatile memory. The method includes the steps of forming a patterned dielectric layer containing arsenic on the substrate. The patterned dielectric layer defines a first opening, i.e. the active area, and the first opening exposes a portion of the substrate and a side wall of the patterned dielectric layer. A dielectric spacer is formed on the side wall of the patterned dielectric layer. A gate dielectric layer is formed on the exposed portion of the substrate. A source/drain region in the substrate is formed by a thermal driving process to diffuse arsenic atoms of the patterned dielectric layer into the substrate. A spacer-shaped floating gate is formed on a side wall of the dielectric spacer and over the gate dielectric layer. An interlayer dielectric layer is formed to cover the spacer-shaped floating gate, the patterned dielectric layer and the gate dielectric layer. At last, a control gate filling the first opening is formed on the interlayer dielectric layer.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1A:
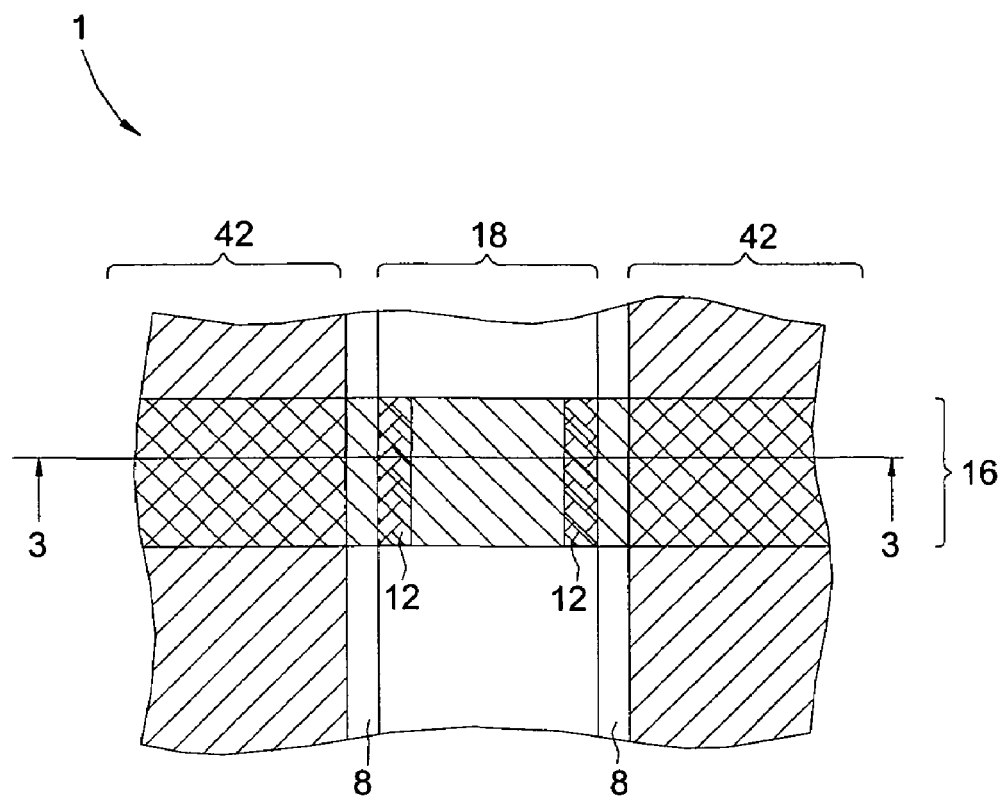
FIG. 1A is a top-view of the multi-bit stacked-type non-volatile memory of one embodiment in accordance with the present invention.
Figure 1B:
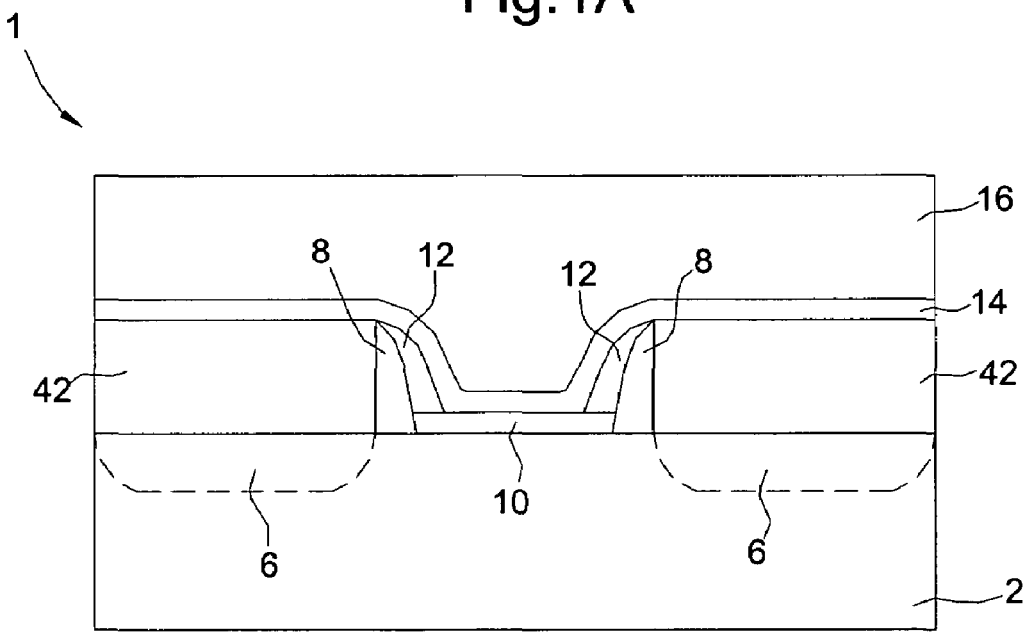
FIG. 1B is a cross-sectional view along the line 3-3 in FIG. 1A.

The present invention provides a multi-bit stacked-type non-volatile memory 1 including spacer-shaped floating gates and the manufacture method thereof. FIG. 1A is a top-view of the multi-bit stacked-type non-volatile memory 1 of one embodiment in accordance with the present invention. FIG. 1B is a cross-sectional view along the line 3-3 in FIG. 1A.

Referring to FIGS. 1A and 1B, the multi-bit stacked-type non-volatile memory 1 of the present invention including a substrate 2, two dielectric islands 42 containing arsenic, two source/drain region 6, two dielectric spacers 8, a gate dielectric layer 10, two spacer-shaped floating gates 12, an interlayer dielectric layer 14, and a control gate 16. The substrate includes a silicon substrate. The materials of the dielectric islands 42 include Arsenosilicate Glass (ASG). The dielectric islands 42 are disposed on the substrate 2, and define an active area 18 between two dielectric islands 42, wherein each of the dielectric islands includes a side wall. Two dielectric spacers 8 are respectively disposed on two side walls of the dielectric islands 42 and over the substrate 2. The gate dielectric layer 10 is disposed on the active area 18. Common material of the gate dielectric layer 10 includes silicon oxide. Two source/drain regions 6 in the substrate 2 are respectively located below two dielectric islands 42. The source/drain regions 6 can be formed by a thermal driving process to diffuse arsenic atoms from the dielectric islands 42 into the substrate 2. Additionally, the two dielectric spacers 8 can prevent arsenic atoms from diffusing into the gate dielectric layer 10 or other undesired areas. Two spacer-shaped floating gates 12 are disposed on the gate dielectric layer 8 and respectively located on two side walls of the dielectric spacers 8. Common material of the spacer-shaped floating gate 12 includes polysilicon. The interlayer dielectric layer 14 is disposed on the substrate 2 and covers at least the spacer-shaped floating gates 12. Common material of the interlayer dielectric layer 14 includes silicon dioxide. The control gate 16 is disposed on the interlayer dielectric layer 14 and fills the active area 18. Common material of the control gate 16 includes polysilicon.

To write data into the multi-bit stacked-typed non-volatile memory 1 of the present invention, a voltage is applied between the control gate 16 and the source/drain region 6 to produce hot electrons moving into the spacer-shaped floating gate 12 and trapped therein. To read data from the multi-bit stacked-typed non-volatile memory 1 of the present invention, the electron contained floating gate will be read as "zero" because of the threshold voltage effect, otherwise will be read as "one".

Figure 2A:
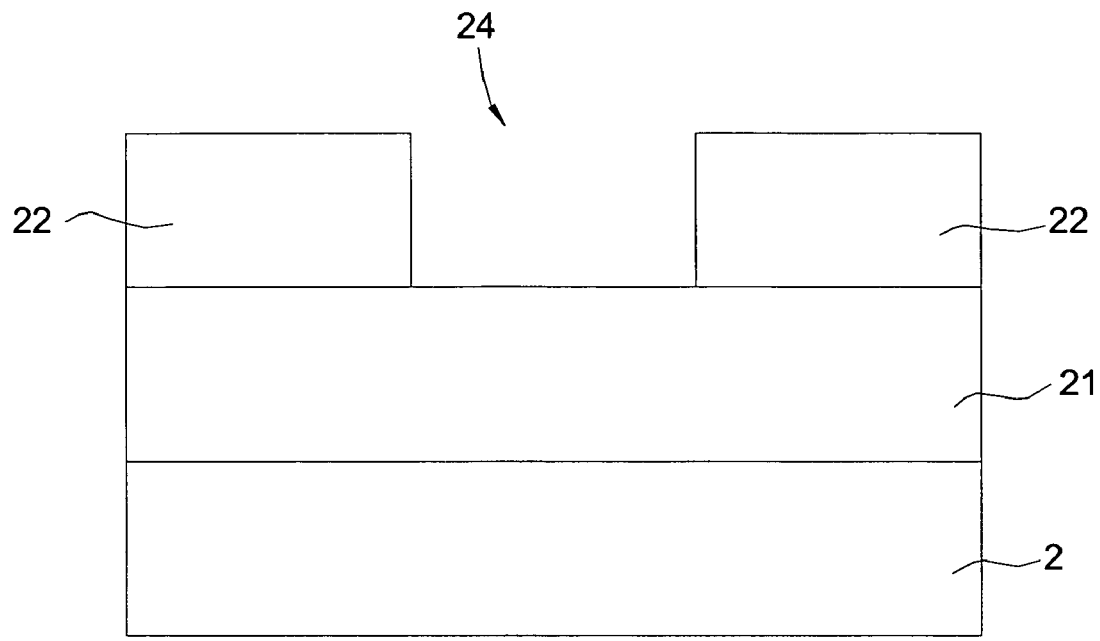
FIG. 2A is a cross-sectional view of the multi-bit stacked-type non-volatile memory during the first photolithography process.
Figure 2B:
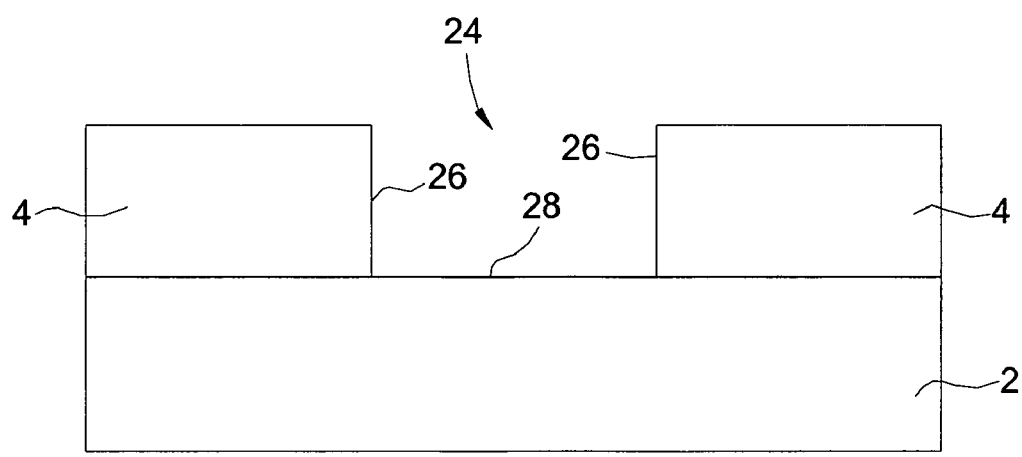
FIG. 2B is a cross-sectional view of the multi-bit stacked-type non-volatile memory while the patterned dielectric layer is formed.

Another embodiment of the present invention provides a method of manufacturing the multi-bit stacked-typed non-volatile memory. The multi-bit stacked-typed non-volatile memory 1 contains spacer-shaped floating gate and is formed by two photolithography processes in this method. Referring to FIG. 2A, a dielectric layer 21 containing arsenic is formed on the substrate 2. The substrate 2 includes silicon. The dielectric layer 21 includes Arsenosilicate Glass and can be formed by any well-known process, such as the chemical vapor deposition (CVD). The first photolithography process will follow to define a first opening 24, i.e. the active area. A patterned photoresist layer 22, which defines the active area, is formed on the dielectric layer 21. The dielectric layer 21 is etched by using the patterned photoresist layer 22 as a mask to form the patterned dielectric layer 4. A first opening 24 is formed after the etching process. Consequently, a surface 28 of a portion of the substrate 2 and the side wall 26 of the patterned dielectric layer 4 are exposed (Refer to FIG. 2B). After the etching process, the photoresist layer 22 is removed.

Figure 3A:
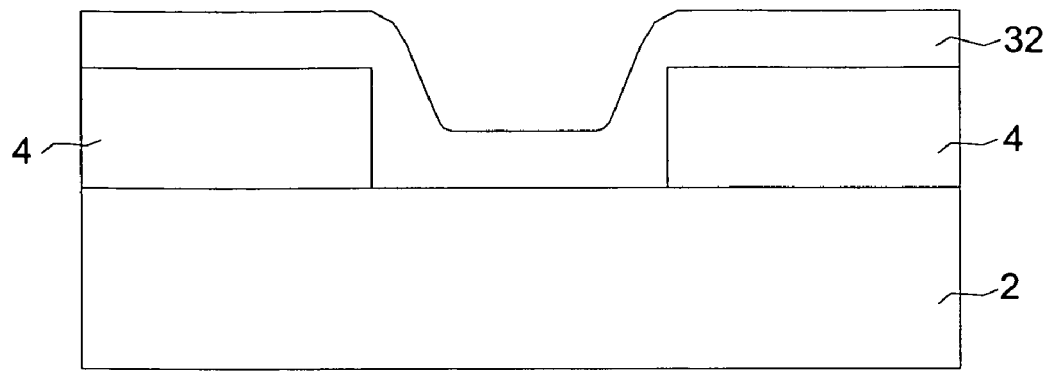
FIG. 3A is a cross-sectional view of the multi-bit stacked-type non-volatile memory while the conformal dielectric layer is formed.
Figure 3B:
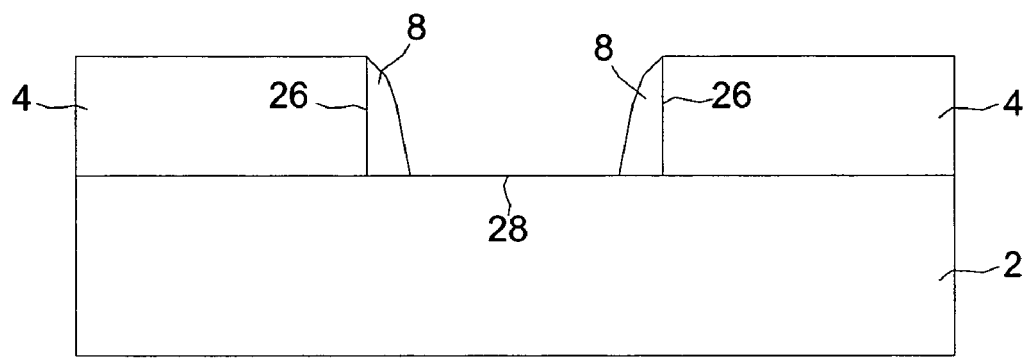
FIG. 3B is a cross-sectional view of the multi-bit stacked-type non-volatile memory while the dielectric spacer is formed.
Figure 4:
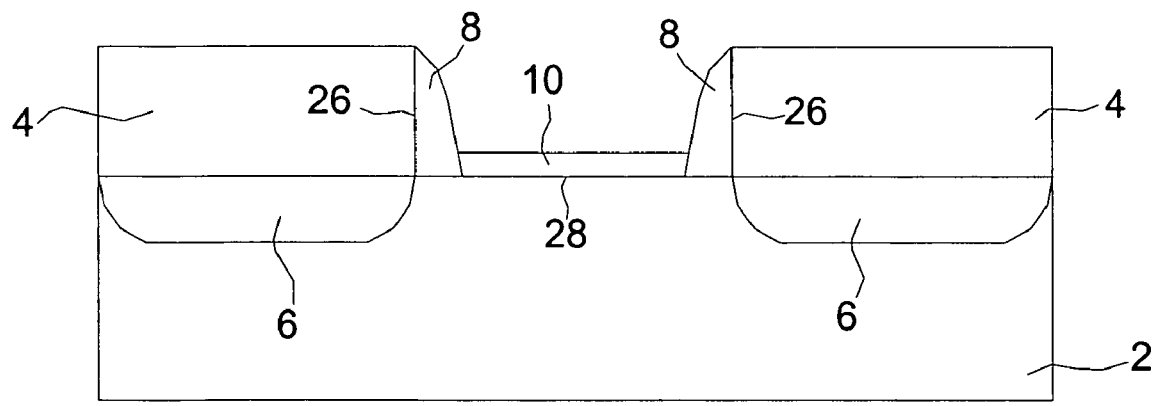
FIG. 4 is a cross-sectional view of the multi-bit stacked-type non-volatile memory while the gate dielectric layer and the source/drain region are formed.

Referring to FIG. 3A, using known methods, such as CVD, form a conformal dielectric layer 32 covering the substrate 2 and the patterned dielectric layer 4. The conformal dielectric layer 32 can use any known dielectric material, such as silicon nitride. Anisotropically etching the conformal dielectric layer 32 forms the dielectric spacers 8 on the side walls 26 of the patterned dielectric layer 4. Referring to FIG. 4, a gate dielectric layer 10 is formed on the exposed portion of the surface 28 of the substrate 2 by using known process, such as thermal oxidation method or deposition method. The material of the gate dielectric layer 10 includes silicon dioxide. The source/drain region 6 is formed by a thermal driving process to diffuse arsenic atoms of the patterned dielectric layer 4 into the substrate 2. The dielectric spacers 8 can prevent arsenic atoms from diffusing into the gate dielectric layer 10 or other undesired areas during the thermal driving process.

Figure 5A:
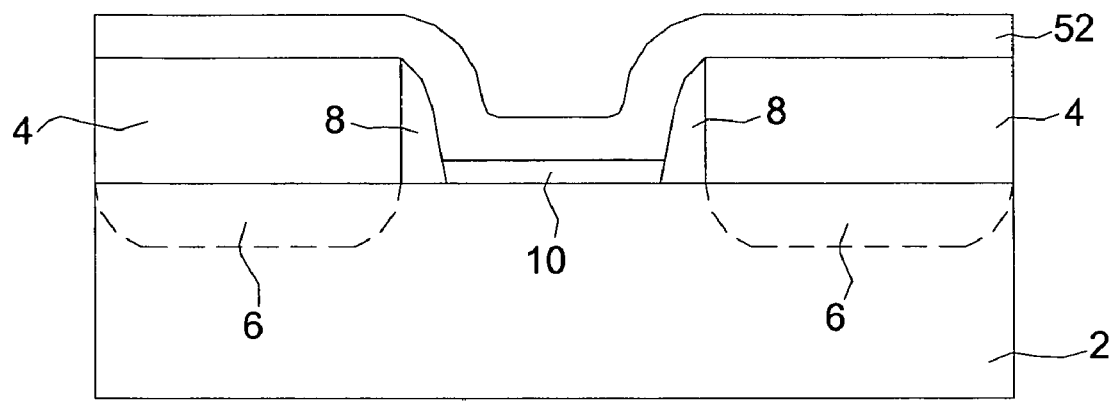
FIG. 5A is a cross-sectional view of the multi-bit stacked-type non-volatile memory while the conformal polysilicon layer is formed.
Figure 5B:
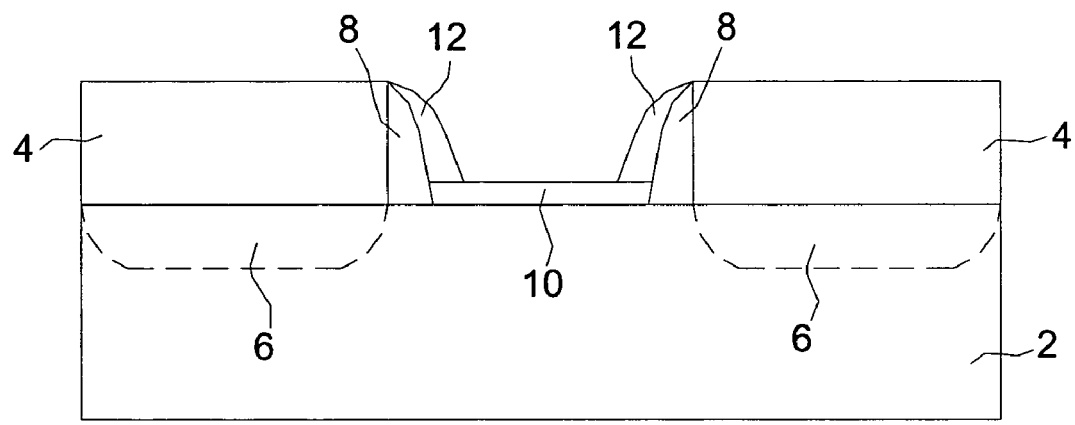
FIG. 5B is a cross-sectional view of the multi-bit stacked-type non-volatile memory while the spacer-shaped floating gate is formed.

Referring to FIG. 5A, using known methods, such as CVD, forms a conformal polysilicon layer 52 covering the gate dielectric layer 10, dielectric spacer 8 and patterned dielectric layer 4. Referring to FIG. 5B, anisotropically etching the conformal polysilicon layer 52 forms the spacer-shaped floating gate 12 on the side wall of the dielectric spacer 8 and the gate dielectric layer 10. Therefore, the spacer-shaped floating gate 12 is self-aligned so that the misalignment can be avoided during the manufacture process. In addition, due to the independent electron storage region in spacer-shaped floating gate 12, the electron disturbance effect can be reduced even when the component size decreases or the density of the memory cells increases.

Figure 6A:
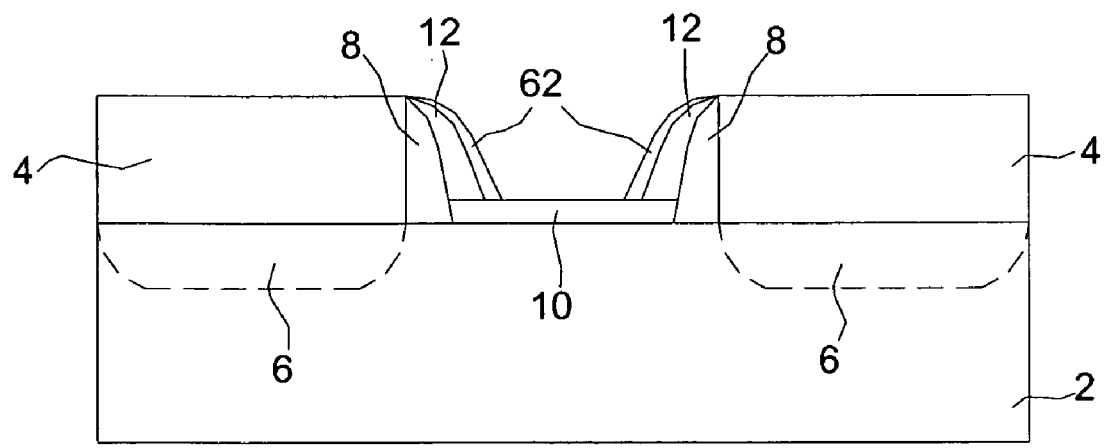
FIG. 6A is a cross-sectional view of the multi-bit stacked-type non-volatile memory while the oxidization layer is formed to cover the spacer-shaped floating gate.
Figure 6B:
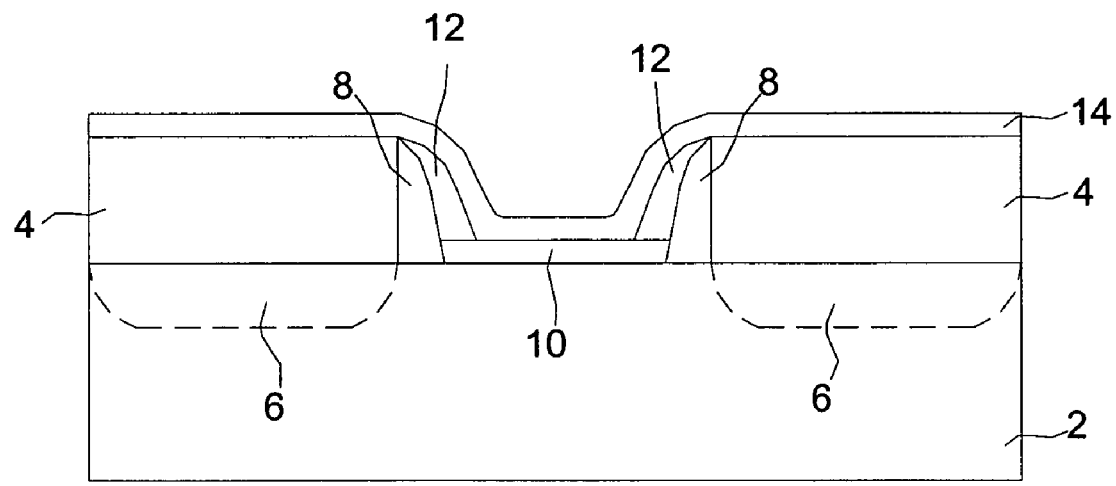
FIG. 6B is a cross-sectional view of the multi-bit stacked-type non-volatile memory while the interlayer dielectric layer is formed.

The interlayer dielectric layer 14 is formed on the spacer-shaped floating gate 12 to separate the control gate 16 from spacer-shaped floating gate 12, i.e. to prevent short circuit. The method of forming the interlayer dielectric layer 14 includes thermal oxidation, deposition, combination of thermal oxidation and deposition, or other known separation techniques. Referring to FIG. 6A, a portion of the surface of the spacer-shaped floating gate 12 is thermally oxidized to form a oxidation layer 62 covering the spacer-shaped floating gate 12. Referring to FIG. 6B, the interlayer dielectric layer 14 is deposited by a chemical vapor deposition process to cover the patterned dielectric layer 4, spacer-shaped floating gate 12 and gate dielectric layer 10. Common material of the interlayer dielectric layer 14 includes silicon dioxide.

Figure 7:
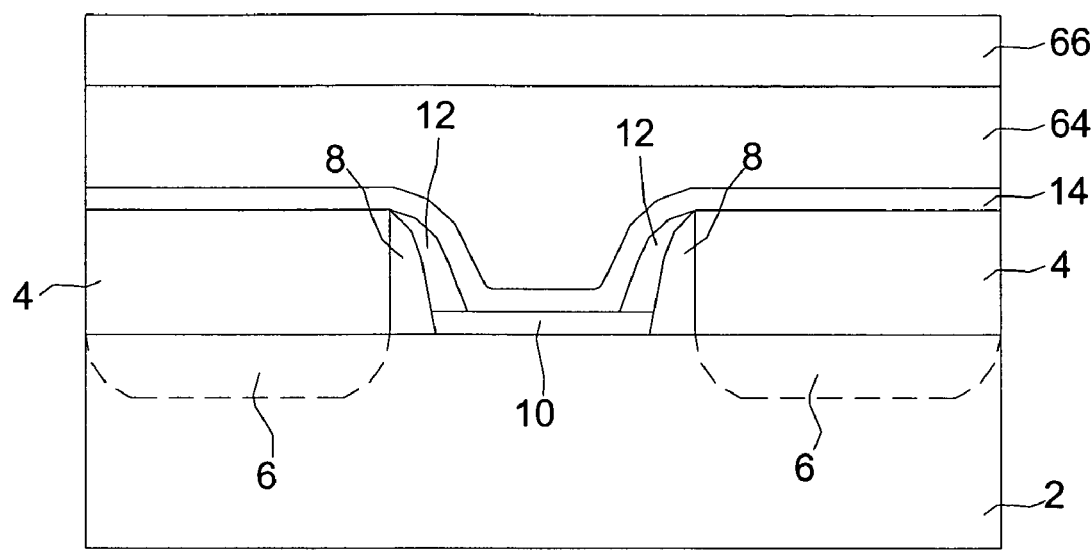
FIG. 7 is a cross-sectional view of the multi-bit stacked-type non-volatile memory during the second photolithography process.

Referring to FIG. 7, using known methods, such as CVD, forms a polysilicon layer 64 covering the interlayer dielectric layer 14 and filling the first opening 24. The second photolithography process will follow to define the word lines. A patterned photoresist layer 66, which defines the word lines, is formed on the polysilicon layer 64. The polysilicon layer 64 is etched by using the patterned photoresist layer 66 as a mask to form the control gate 16. At last, the patterned photoresist layer 66 is removed to form the multi-bit stacked-typed nonvolatile memory 1 of the embodiment in accordance with the present invention.

Figure 8:
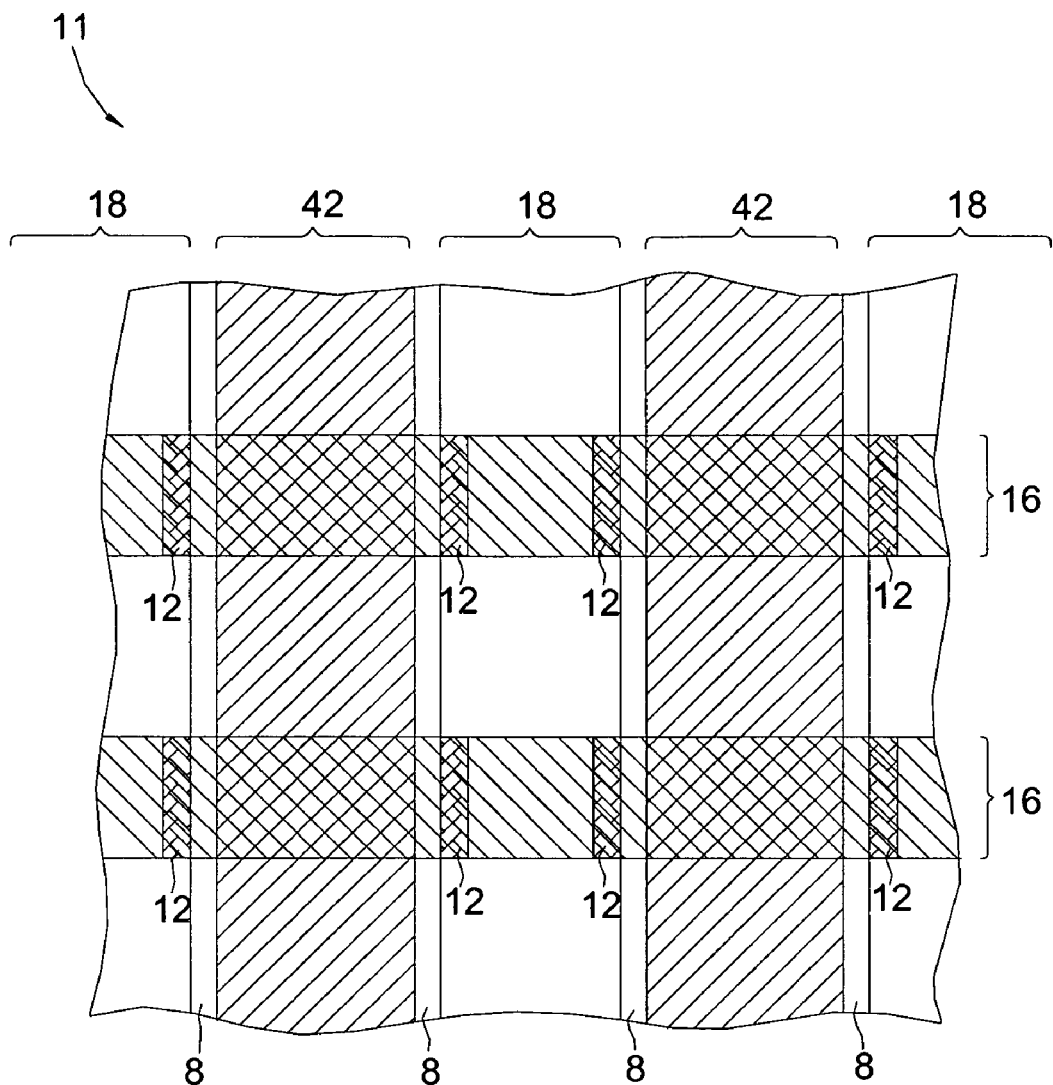
FIG. 8 is a top-view of the multi-bit stacked-type non-volatile memory array of another embodiment in accordance with the present invention.

It should be noted that although the above description recites a single memory cell as an exemplary embodiment, the skilled in the art should realize that the present invention could be a memory array. FIG. 8 is a top-view of the multi-bit stacked-type non-volatile memory array 11 in accordance with the present invention. In this embodiment, the multi-bit stacked-type non-volatile memory array 11 includes a plurality of the multi-bit stacked-type nonvolatile memory 1. Each memory 1 of the multi-bit stacked-type non-volatile memory array 11, as the fore-mentioned embodiment, includes a substrate 2, a patterned dielectric layer 4 containing arsenic, a source/drain regions 6, dielectric spacers 8, a gate dielectric layer 10, spacer-shaped floating gates 12, a interlayer dielectric layer 14, and a control gate 16. The multi-bit stacked-type non-volatile memory array 11 further includes a plurality of source/drain region 6, a plurality of dielectric islands 42 containing arsenic, and a plurality of control gate 16. Each two adjacent dielectric islands define an active area 18. The control gates 16 define a plurality of word lines, and the source/drain regions 6 define a plurality of bit lines. The source/drain regions 6 are formed by a thermal driving process to diffuse arsenic atoms from the dielectric islands 42 into the substrate 2.

The manufacture method and operation characteristics are the same as the single memory cell and are not elaborated here for conciseness.

The above description only sets forth preferred embodiment of the invention, and is not intended to limit the scope, applicability, or configuration of the invention in any way. Rather, various changes may be made in the function and arrangement of the elements described in the embodiment without departing from the spirit and scope of the invention. Thus, the protected scope of the present invention is as set forth in the appended claims.

What is claimed is:

1. A structure of a multi-bit stacked-type non-volatile memory, comprising:
    a substrate;
    two dielectric islands containing arsenic on the substrate and defining an active area between the two dielectric islands, wherein each of the dielectric islands includes a side wall;
    two source/drain regions in the substrate being respectively located below the two dielectric islands;
    two dielectric spacers respectively disposed on the side walls of the two dielectric islands;
    a gate dielectric layer on the active area;
    two separate spacer-shaped floating gates on the gate dielectric layer and being respectively located on two side walls of the two dielectric spacers;
    an interlayer dielectric layer on the spacer-shaped floating gates; and
    a control gate filling the active area.

2. The structure according to claim 1, wherein the substrate comprises a silicon substrate.

3. The structure according to claim 1, wherein the dielectric islands comprise Arsenosilicate Glass (ASG).

4. The structure according to claim 1, wherein the dielectric spacers comprise silicon nitride.

5. The structure according to claim 1, wherein the spacer-shaped floating gates comprise polysilicon.

6. The structure according to claim 1, wherein the interlayer dielectric layer comprises silicon oxide.

7. The structure according to claim 1, wherein the control gate comprises polysilicon.

\* \* \* \* \*